(12) United States Patent  
Patel

(10) Patent No.: US 12,453,053 B2
(45) Date of Patent: *Oct. 21, 2025

(54) HEAT SINK THAT VARIES IN HEIGHT

(71) Applicant: Core Scientific, Inc., Austin, TX (US)

(72) Inventor: Harsh Patel, Stone Mountain, GA (US)

(73) Assignee: Core Scientific, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/752,781

(22) Filed: Jun. 24, 2024

(65) Prior Publication Data

US 2024/0349456 A1 Oct. 17, 2024

Related U.S. Application Data

(63) Continuation of application No. 17/738,646, filed on May 6, 2022, now Pat. No. 12,041,754.

(60) Provisional application No. 63/185,434, filed on May 7, 2021.

(51) Int. Cl.
*H05K 7/20* (2006.01)

(52) U.S. Cl.
CPC ....... *H05K 7/2039* (2013.01); *H05K 7/20709* (2013.01)

(58) Field of Classification Search
CPC ..... H01L 23/467; H01L 23/3672; G06F 1/20; F28F 13/06; F28F 2215/04; F28F 1/32; F28F 3/00; F28F 27/02; H05K 7/20154; H05K 7/20145; H05K 7/20909; F28D 2021/0029
USPC .................................................. 361/679.54
See application file for complete search history.

(56) References Cited

U.S. PATENT DOCUMENTS

| 4,765,397 | A | 8/1988 | Chrysler | |
|---|---|---|---|---|
| 6,622,786 | B1 | 9/2003 | Calmidi | |
| 6,807,059 | B1 | 10/2004 | Dale | |
| 6,935,419 | B2* | 8/2005 | Malone | F28F 3/02 165/146 |
| 12,041,754 | B1* | 7/2024 | Patel | H05K 7/20154 |
| 2009/0145581 | A1* | 6/2009 | Hoffman | F28F 3/14 165/80.3 |
| 2011/0079370 | A1* | 4/2011 | Wen | H01L 23/367 165/80.3 |
| 2014/0014308 | A1* | 1/2014 | Wu | H05K 7/20409 165/185 |
| 2014/0027102 | A1* | 1/2014 | Antel, Jr. | F28D 1/0246 165/185 |
| 2017/0241721 | A1* | 8/2017 | Liang | F28F 3/048 |
| 2018/0024599 | A1* | 1/2018 | Sakata | F28F 3/06 361/679.47 |
| 2023/0320035 | A1* | 10/2023 | Gregory | H01L 23/3672 165/80.3 |

FOREIGN PATENT DOCUMENTS

JP 2003188321 A * 7/2003
WO WO-2021228089 A1 * 11/2021

* cited by examiner

*Primary Examiner* — Mandeep S Buttar
(74) *Attorney, Agent, or Firm* — Fishman Stewart PLLC

(57) ABSTRACT

A heat sink for cooling computing devices is disclosed. The heat sink includes a plurality of fin stages arranged in spaced relation between an intake side and an exhaust side. The plurality of fin stages each include a plurality of fins extending along a flow direction. At least one of the plurality of fin stages is distinct in fin width and/or fin height from another one of the plurality of fin stages.

20 Claims, 4 Drawing Sheets

HEAT SINK THAT VARIES IN HEIGHT

CROSS-REFERENCE TO RELATED APPLICATION

This application is a continuation application of U.S. application Ser. No. 17/738,646, filed on May 6, 2022, which claims the benefit of and priority to U.S. Provisional Patent Application Ser. No. 63/185,434, filed on May 7, 2021, the disclosure of each of which is hereby incorporated by reference in its entirety as though fully set forth herein.

TECHNICAL FIELD

The present disclosure generally relates to the field of computing and, particularly, to systems and apparatuses for cooling computing devices such as in a data center, and more particularly to heat sinks for data miners that vary in height.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Many data centers face cooling challenges, and data centers housing large numbers of miners or other CPU- or GPU-based systems used for compute intensive workloads (e.g., rendering, AI, machine learning, scientific simulation, data science) have even greater cooling challenges. This is due to the significantly higher density, power usage, heat generation, and duty cycle common to these devices and workloads.

The heat in data centers can often exceed the cooling ability of a computing device's built-in fans, which force air across heat sinks on the computing device in order to extract and exhaust the waste heat. Heat sinks are traditionally formed as plate fin designs. Due to the limited space available on mining rig chip boards, the heat sink is usually designed with small fin spacing to accommodate more fins to improve thermal performance. A significant drawback to this approach is that downstream fins of the heat sink demonstrate reduced heat transfer efficiency due to the temperature of the cooling air rising as it passes over each stage.

For at least these reasons, there is a desire for a more energy efficient solution to allow for improved efficient cooling and thermal management of computing devices in a data center.

SUMMARY

A heat sink and system for improved cooling of computing devices are contemplated. According to an aspect, a heat sink for cooling computing devices includes a plurality of fin stages arranged in spaced relation between an intake side and an exhaust side. The plurality of fin stages have a height that increase from the intake side to the exhaust side. The increase in height towards the exhaust or outlet side increases the surface area of the fins in regions requiring a greater heat removal rate due to rise in cooling air temperature as the air extracts waste heat from the computing device. As the air temperature is cooler towards the inlet or intake side, the upstream fin stages (e.g., the first and second fin stages) can be made shorter without significant sacrifices to heat removal efficiency, thereby achieving material savings.

Pursuant to an implementation, the height of the plurality of fin stages increases successively with a shortest one of the plurality of fin stages being disposed proximate to the intake side and a tallest one of the plurality of fin stages being disposed proximate to the exhaust side.

Additionally or alternatively, the plurality of fin stages increase in height by approximately 5%-25%.

Pursuant to an implementation, the plurality of fin stages may have a width that increases from the intake side to the exhaust side. The width extends parallel to the flow direction, and perpendicular to the height.

Pursuant to another implementation, a plurality of air separators may be provided to extend from the intake side downstream to a corresponding one of the plurality of fin stages. The plurality of air separators may be positioned at a different height relative to one another, and may have a different longitudinal extent or length) from one another. The air separators guide cooler (e.g., ambient) air to each stage of fins, so that downstream fin stages have access to ambient air for enhanced cooling. The air separators (e.g., baffles or flow guides) may be attached to a casing of the computing device, or formed integrally with the casing.

According to another aspect, a system for cooling computing devices includes a casing having an air inlet and an air outlet; a chip board arranged within the casing; and a heat sink disposed on the chip board, the heat sink including a plurality of fin stages arranged in spaced relation from one another between the air inlet and the air outlet. The plurality of stages have a height that increases from the air inlet to the air outlet.

According to an implementation, the plurality of fin stages have a width that increases from the air inlet to the air outlet.

The casing may include a plurality of air separators of different lengths extending from the air inlet in a downstream direction. The plurality of air separators may be disposed at different heights relative to the chip board to separate air for the plurality of heat sinks.

Pursuant to an implementation, a first fan disposed at the air inlet and a second fan disposed at the air outlet. The first and second fans force air through the heat sink for force-air convention cooling.

The foregoing and other aspects, features, details, utilities, and/or advantages of embodiments of the present disclosure will be apparent from reading the following description, and from reviewing the accompanying drawings.

BRIEF DESCRIPTION OF THE DRAWINGS

While the claims are not limited to a specific illustration, an appreciation of the various aspects is best gained through a discussion of various examples thereof. Although the drawings represent illustrations, the drawings are not necessarily to scale and certain features may be exaggerated to better illustrate and explain an innovative aspect of an example. Further, the exemplary illustrations described herein are not intended to be exhaustive or otherwise limiting or restricted to the precise form and configuration shown in the drawings and disclosed in the following detailed description. Exemplary illustrations are described in detail by referring to the drawings as follows.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
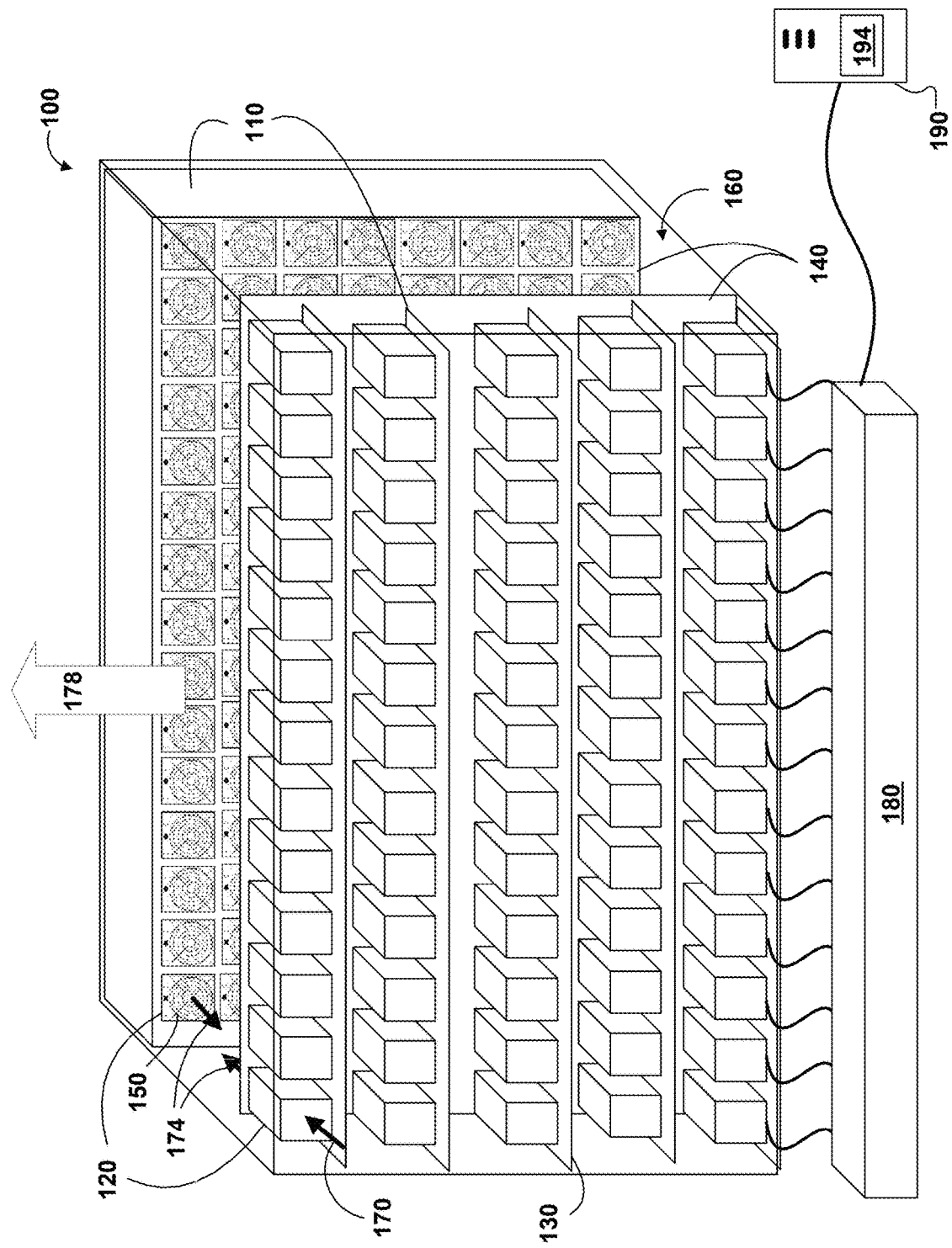
FIG. 1 is a diagram generally illustrating computing devices in a data center.

Referring now to FIG. 1, a diagram generally illustrating computing devices in a data center is shown. This example illustrates a pod 100 that has racks 110 that each have a number of shelves 130 for holding computing devices 120, thereby creating a two-dimensional array of computing devices on each rack or group of racks. In other embodiments, racks 110 may have rails that hold computing devices 120 in place on shelves 130. Each computing device 120 has one or more cooling fans 150 configured to draw air from outside the pod (often called a cool aisle) into the computing device for cooling, as shown by arrow 170. The moving air draws out heat from computing device 120 and is exhausted from the computing device as shown by arrows 174.

In some embodiments, computing device 120 may have two fans, one on the intake side and one on the exhaust side. In other embodiments multiple smaller fans may be used within computing device 120. Heated air is exhausted by computing devices 120 into the space between racks 110, called a hot aisle 160. The space between racks 110 is typically sealed except for one or more exhaust openings, typically in the ceiling, through which the heated air exits (as shown by arrow 178). In some embodiments, computing devices 120 are positioned adjacent to an air barrier 140 with openings large enough to allow the heated exhaust air from each computing device 120 to pass into hot aisle 160 but not escape out of hot aisle 160 other than through the exhaust vents.

Computing devices 120 may be networked together with a network switch 180 and may be managed by a management program 194 executing on a management computer 190. The management application or module is typically implemented in software (e.g., instructions stored on a non-volatile storage medium such as a hard disk, flash drive, or DVD-ROM).

In order to better cool computing devices 120, the management program 194 may be configured to dispatch instructions to computing devices 120 setting their operating parameters such as chip frequency, voltage, and fan speed.

Figure 2:
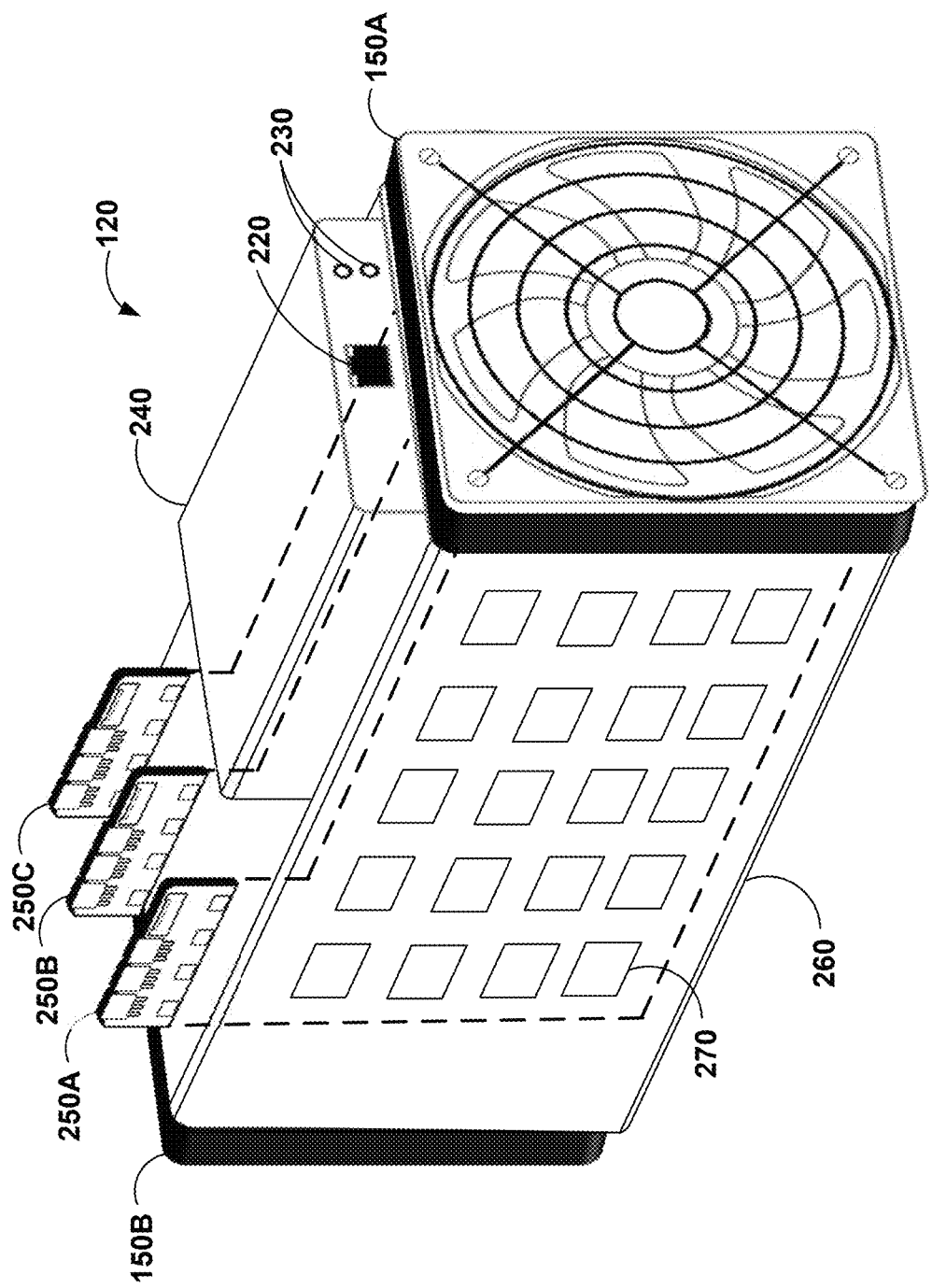
FIG. 2 is a diagram generally illustrating a perspective view of an example computing device.

Turning now to FIG. 2, a diagram generally illustrating a perspective view of an example computing device 120 is shown. In this example, computing device 120 is a cryptocurrency miner and includes a controller 240 that oversees operation of the multiple processing circuit boards 250A-C inside the device's case 260. In this embodiment, the controller 240 includes a network port 220 for communications, and one or more status indicator LEDs 230. Two fans 150A-B (one front and one rear) draw cool air into one side of the computing device 120 and expel waste heat through the other side. Other types of computing devices are possible and contemplated.

Circuit boards 250A-C each have multiple processors 270 (e.g., ASICs, GPUs, CPUs, FPGAs) that perform calculations, generating heat. For this reason, processors 270 often have heat sinks attached to them to cool the processors 270 by dissipating the waste heat into the air flowing through the computing device.

Figure 3:
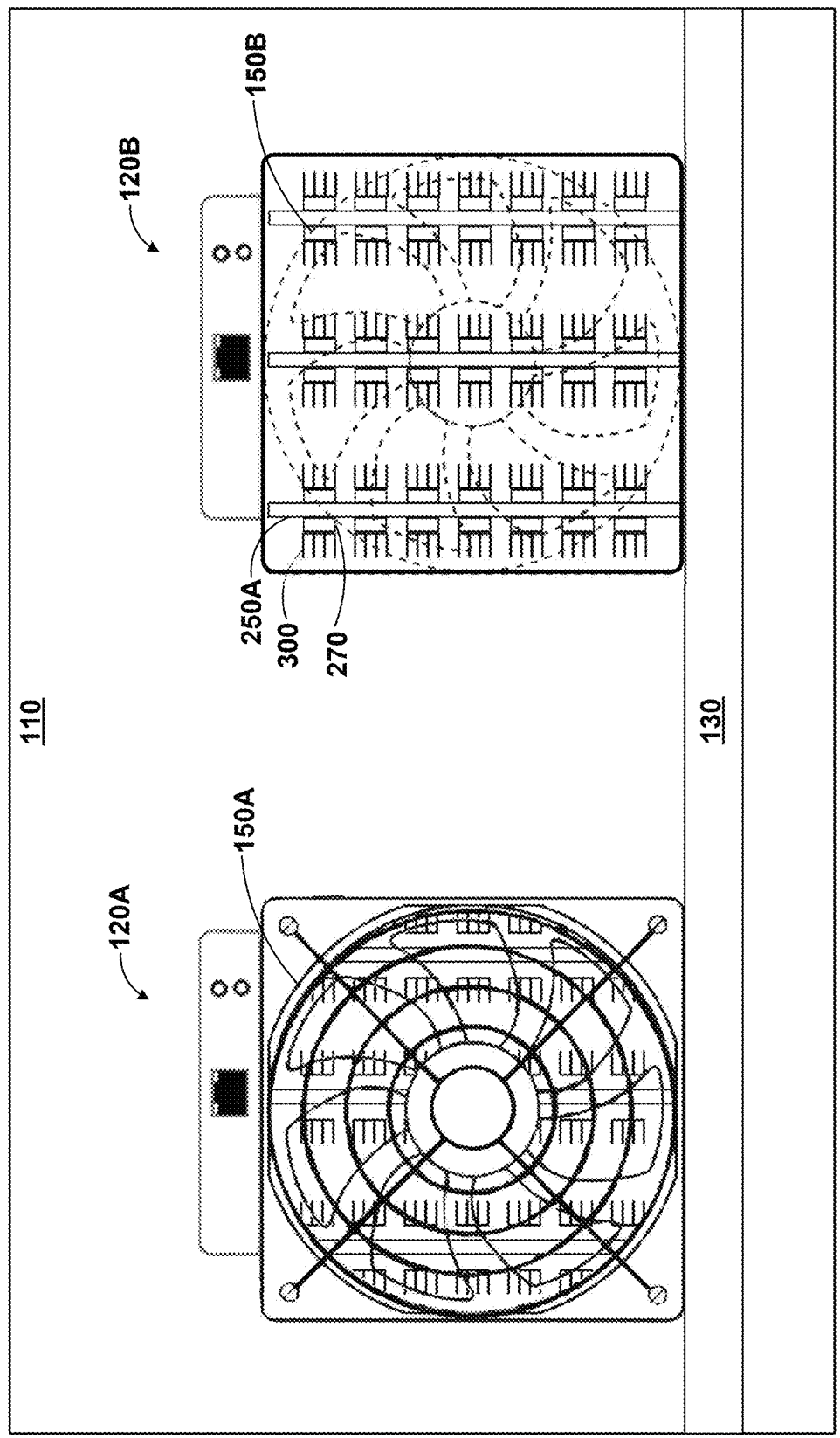
FIG. 3 is a diagram generally illustrating computing devices in a rack.

Turning now to FIG. 3, a diagram generally illustrating computing devices in a rack is shown. A frontal view of two computing devices 120A and 120B positioned on a shelf 130 is shown. In this view, front fans 150A and 150B are shown. Fan 150B is shown partially hidden to allow heatsink 300 connected to processor 270 on circuit board 250A to be sec.

Figure 4:
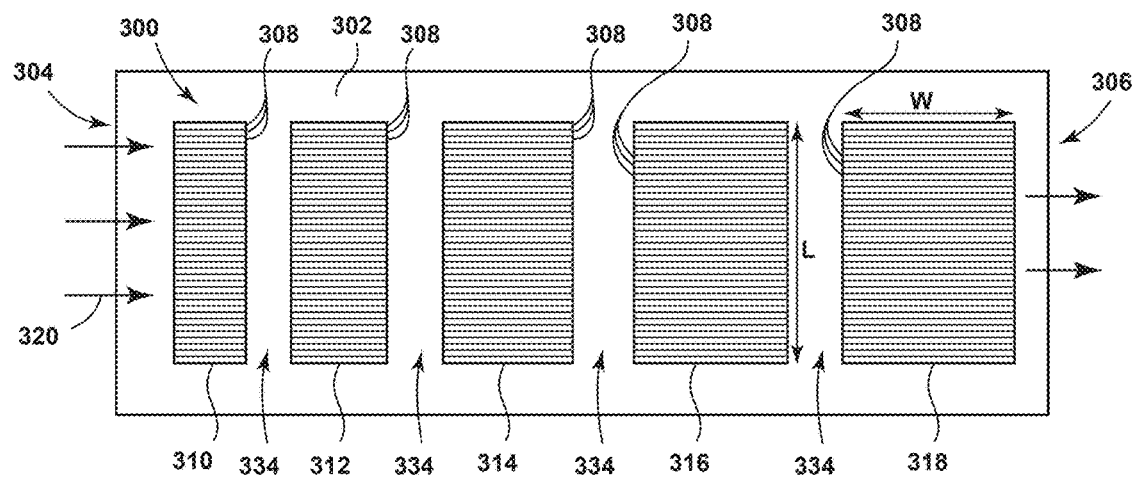
FIG. 4 is a top-down view of a heat sink for cooling computing devices according to an example.

Referring to FIG. 4, a top-down view of a heat sink 300 for cooling computing devices 120 according to an example is shown. The heat sink 300 is thermally coupled to electronics (e.g., processor 270; see FIG. 3) of the computing device 120. Pursuant to an implementation, the heat sink 300 is disposed on a chip board 302 (e.g., circuit board 250A-C) to remove heat from the computing devices 120. The heat sink 300 takes in cool air via an air intake or inlet 304, extracts waste heat from the computing device 120, and exhausts the air via air exhaust or outlet 306. The heat sink 300 may be composed of a metal (e.g., aluminum) and comprises fins 308 (e.g., longitudinal fins) disposed on a cooling plate (not shown). Although the fins 308 are shown as longitudinal (e.g., rectangular) fins 308, it will be appreciated that the fins 308 may have other shapes including, but not limited to, curved, wavy, and pin-shaped. The fins 308 may be arranged in two or more fin stages or fin groupings. The illustrated example shows five stages 310, 312, 314 316, 318 of fins 308. As discussed below, the fin stages 310-318 may be distinct in fin width w and/or fin height h. It will be appreciated that more or less fin stages are contemplated without departing from the scope of the disclosure. Each stage 310-318 of fins 308 may be separated from an adjacent stage by a spacing 334 in the flow direction 320, which spacing may provide a mixing region for air to enhance cooling. Alternatively, the fin stages 310-318 may be contiguous or adjacent to one another (e.g., without a spacing in between).

Pursuant to an implementation, the plurality of fin stages 310-318 may have a width w that increases from the air inlet 304 to the air outlet 306, so that the first stage 310 may have the smallest width w and the fifth stage 318 may have a largest width w. The width w of the stages 310-318 may increase successively, so that the width w of stage 312 is greater than that of stage 310, the width w of stage 314 is greater than that of stage 312, the width w of stage 316 is greater than that of 314, and the width w of stage 318 is greater than that of stage 316. The increasing width w from the inlet 304 to the outlet 306 increases the surface area of the fins 308 of downstream stages, to help improve the overall heat removal rate.

Pursuant to a non-illustrated implementation, additionally or alternatively, the plurality of stages 310-318 may have a length/that increases from the air inlet 304 to the air outlet 306, such that the first stage 310 has the smallest length/and the fifth stage 318 has the greatest length l. In this manner, the total surface area of each stage 310-318 increases in the flow direction 320 to help improve overall heat removal rate.

Figure 5:
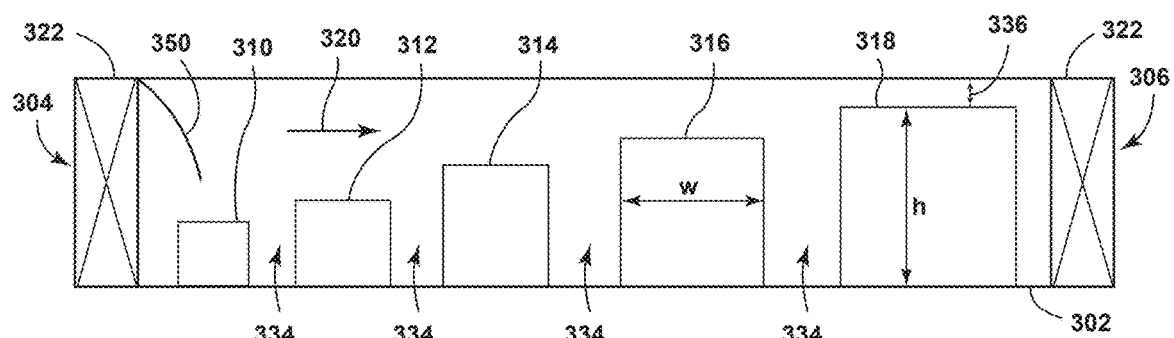
FIG. 5 is a side view of the heat sink of FIG. 4.

FIG. 5 shows a side view of the heat sink 300 according to FIG. 4. FIG. 5 illustrates that the fin stages 310-316, in addition to having a width w that increases in the flow direction 320 (i.e., from the inlet 304 to the outlet 306), also have a height h that increases in the flow direction 320. According to the illustrated example, the heat sink includes stages 310-318 of fins 308 that successively increase in height h in the flow direction 320 (e.g., width direction), so that the first stage 310 has the shortest height h and the fifth stage 318 has the tallest height h. In the illustrated example, middle stages 312-316 increase successively in the flow direction 320, however, it is contemplated that at least two stages, e.g., stages 312 and 314, may have the same height h, without departing from the scope of the disclosure. Pursuant to an implementation, the height h of each stage 310-318 may increase by approximately 5%-25%, particularly 7%-13%, and more particularly by approximately 10%, to maximize the heat transfer efficiency without an appreciable increase in flow resistance or pressure drop. At the fifth fin stage 318, there is a gap 336 (in the height direction) between the top of the fins 308 and the adjacent chip board. The gap 336 provides an air cushion (e.g., electrical insulation) to avoid short circuiting or electrical arcing. In operation, fans 322 at the inlet 304 and the outlet 306 force air through the heat sink 300 in the flow direction 320 to cool the computing device 120, wherein heat removal is facilitated by the height h of the fins 308 increasing in stages 310-318 in the downstream direction. By dissipating heat produced by the electronics in the computing device 120, the heat sink 300 improves thermal regulation of the computing device 120.

Figure 6:
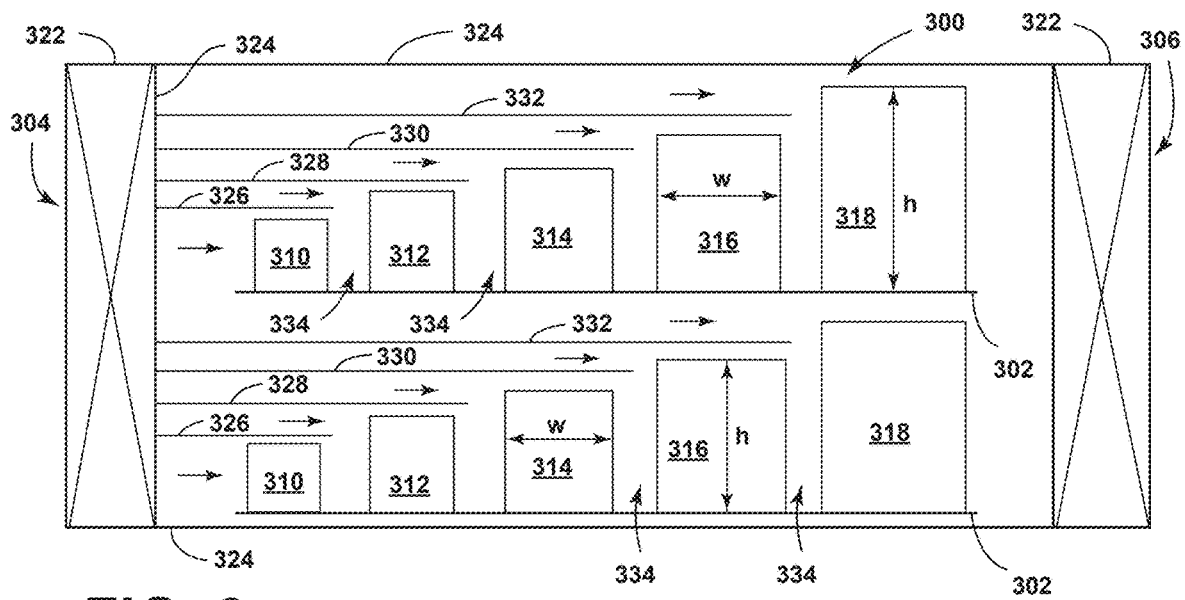
FIG. 6 is a side view of a heat sink for cooling computing devices according to another example.

FIG. 6 shows a further development of the heat sink 300 shown in FIGS. 4 and 5. FIG. 6 shows an arrangement of two chip boards 302 (e.g., a pair of parallel rows) within a casing 324 of a computing device 120 (e.g., a mining rig), wherein each chip board 302 has a plurality of fin stages 310-318 arranged in spaced relation along the width w direction (e.g., in the flow direction 320). The fin stages 310-318 have a height h that increases successively downstream from one another, wherein the height h increases by approximately 5%-25% (e.g., 10%+/−3%) from the first stage 310 to the second stage 312, from the second stage 312 to the third stage 314, from the third stage 314 to the fourth stage 316, and from the fourth stage 316 to the fifth stage 318. The increasing height h downstream of the intake or inlet 304 increases the surface area of the fins 308 to help better dissipate waste heat and compensate for the raising air temperature as the air moves from one stage to the next. The fin stages 310-318 may optionally have a width w that increases successively from one stage to the next in the flow direction to further increase the heat transfer of downstream stages.

The construct shown in FIG. 6 further includes air separators 326, 328, 330, 332 (e.g., baffles or flow guides) extending from the casing 324 in the flow direction (e.g., the width direction) to further improve heat transfer efficiency by directing cool air to each stage 310-318 of fins 308. The air separators 326-332 may be attached to, or formed integrally with, the casing 324. The air separators 326-332 extend transversely to the height h direction and have different longitudinal extents or lengths to separate cooling air into discrete air flows that are guided to individual fin stages 310-318. Further, the air separators 326-332 are positioned at varying heights from the associated chip board to separate air flow and provide colder air (indicated by arrow) to each fin stage 310-318. The air separators 326-332 may extend over the entire width w of the associated fin stage 310-318, or only a portion thereof. The air separators 326-332 may be substantially flat and rectangular as shown, or may be curved or bent without departing from the scope of the disclosure.

During operation, fans 322 at the inlet 304 and outlet 306 force air through the heat sink 300, wherein the air separators 326 separate the air flow and guide cooler air (indicated by arrows) to each stage 310-318 to increase waste heat removal. For example, air flow between air separators 326 and 328 bypasses the first stage 310 to provide cold (e.g., ambient) air to the second stage 312, air flow between air separators 328 and 330 bypasses the first and second stages 310, 312 to provide cold (e.g., ambient) air to the third stage 314, air flow between air separators 330 and 332 bypasses the first, second, and third stages 310-314 to provide cold (e.g., ambient) air to the fourth stage 316, and air flow between air separator 332 and adjacent chip board 302 or casing 324 bypasses the first, second, third, and fourth stages 310-316 to provide cold (e.g., ambient) air to the fifth stage 318.

It will be appreciated that the example shown in FIG. 6 may only have one chip board 302 and heat sink 300 without departing from the scope of the disclosure. For example, the casing 324 and air separators 326-332 may be combined with FIGS. 4 and 5. Further, it will be appreciated that fewer air separators may be provided without departing from the scope of the disclosure. For example, the air separator 326 may be removed, so that the first and second stages 310, 312 receive a common air flow.

It will be appreciated that the aforementioned apparatus and system may be modified to have some components removed, or may have additional components and steps added, all of which are deemed to be within the spirit of the present disclosure. Accordingly, even though the present disclosure has been described in detail with reference to specific examples, it will be appreciated that the various modifications and changes can be made to these examples without departing from the scope of the present disclosure as set forth in the claims. It is anticipated and intended that future developments will occur in the technologies discussed herein, and that the disclosed method, device and/or article will be incorporated into such future developments. Thus, the specification and the drawings are to be regarded as an illustrative thought instead of merely restrictive thought.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments. Further, all numbers expressing dimensions, ratios and the like, used in the specification and claims, are to be understood to encompass tolerances and other deviations as represented by the term "about" or "approximately." Moreover, all ranges disclosed herein are to be understood to encompass any and all sub-ranges subsumed therein.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A heat sink for cooling computing devices, comprising:
   a plurality of fin stages arranged in spaced relation between an intake side and an exhaust side, the plurality of fin stages each including a plurality of fins extending along a flow direction;
   wherein at least one of the plurality of fin stages is distinct in fin width and/or fin height from another one of the plurality of fin stages; and
   a plurality of air separators extending from the intake side downstream to a corresponding one of the plurality of fin stages.

2. The heat sink of claim 1, wherein a fin height of the plurality of fin stages increases successively from the intake side to the exhaust side with a shortest one of the plurality of fin stages being disposed proximate to the intake side and a tallest one of the plurality of fin stages being disposed proximate to the exhaust side.

3. The heat sink of claim 1, wherein at least one of:
a fin height of each of the plurality of fin stages increases by 5%-25% from the intake side to the exhaust side; and
the plurality of fins of at least one of plurality of fin stages are longitudinal rectangular fins.

4. The heat sink of claim 1, wherein the plurality of fin stages have a fin width that increases from the intake side to the exhaust side.

5. The heat sink of claim 1, wherein at least one of:
the plurality of air separators extend over an entire width of the corresponding one of the plurality of fin stages; and
the plurality of air separators comprise baffles that are substantially flat and rectangular.

6. The heat sink of claim 1, wherein at least one of:
the plurality of air separators are positioned at a different height relative to one another; and
each of the plurality of air separators have a different longitudinal extent from one another.

7. The heat sink of claim 1, wherein each fin stage of the plurality of fin stages are separated from an adjacent stage by a spacing in the flow direction.

8. A system for cooling computing devices, comprising:
a casing having an air inlet and an air outlet;
a chip board arranged within the casing;
a heat sink disposed on the chip board, the heat sink including a plurality of fin stages arranged in spaced relation from one another between the air inlet and the air outlet, the plurality of fin stages each including a plurality of fins extending along a flow direction;
wherein at least one of the plurality of fin stages is distinct in fin width and/or fin height from another one of the plurality of fin stages; and
wherein the casing includes a plurality of air separators extending from the air inlet in a downstream direction.

9. The system of claim 8, wherein the plurality of fin stages include a first fin stage at the air inlet with a smaller width than a further fin stage closer to the air outlet.

10. The system of claim 8, wherein at least one of:
the plurality of air separators extend over an entire width of an associated one of the plurality of fin stages;
the plurality of air separators are formed integrally with the casing;
the plurality of air separators respectively extend in the downstream direction to a corresponding one of the plurality of fin stages; and
the plurality of air separators are substantially flat and rectangular.

11. The system of claim 8, wherein at least one of:
the plurality of air separators are disposed at different heights relative to the chip board to separate air for the plurality of heat sinks; and
the plurality of air separators have a different length from one another.

12. The system of claim 8, wherein the plurality of air separators comprise baffles or flow guides.

13. The system of claim 8, wherein the plurality of fin stages have a fin height that increases from the air inlet to the air outlet.

14. The system of claim 13, wherein a fin stage proximal to the air outlet has a gap in a height direction from a top of the plurality of fins and the adjacent chip board.

15. The system of claim 8, a fin height of the plurality of fin stages increases from each stage by 5%-25% from the intake side to the exhaust side.

16. The system of claim 8, further comprising a second chip board arranged in parallel with the chip board within the casing, the second chip board including a second plurality of fin stages arranged in spaced relation along the flow direction.

17. The system of claim 8, wherein each fin stage of the plurality of fin stages are separated from an adjacent stage by a spacing in the flow direction.

18. The system of claim 8, further comprising a fan disposed at the air inlet and/or the air outlet.

19. The system of claim 8, further comprising a computing device, wherein the casing is part of the computing device.

20. The system of claim 8, wherein the heat sink is composed of a metal.

* * * * *